United States Patent
Fay

(10) Patent No.: US 9,654,064 B2
(45) Date of Patent: *May 16, 2017

(54) AMPLIFIER APPARATUS WITH CONTROLLED NEGATIVE OUTPUT IMPEDANCE

(71) Applicant: Panasonic Automotive Systems Company of America, Division of Panasonic Corporation of North America, Peachtree City, GA (US)

(72) Inventor: Richard Fay, Newnan, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/950,160

(22) Filed: Nov. 24, 2015

(65) Prior Publication Data

US 2016/0079937 A1    Mar. 17, 2016

Related U.S. Application Data

(63) Continuation-in-part of application No. 13/718,400, filed on Dec. 18, 2012, now Pat. No. 9,225,301.

(51) Int. Cl.
| H03F 3/21 | (2006.01) |
| H03F 1/32 | (2006.01) |
| H03F 1/56 | (2006.01) |
| H03F 3/187 | (2006.01) |

(Continued)

(52) U.S. Cl.
CPC .............. *H03F 3/21* (2013.01); *H03F 1/32* (2013.01); *H03F 1/56* (2013.01); *H03F 3/187* (2013.01); *H03F 3/213* (2013.01); *H03F 3/45475* (2013.01); *H03F 2200/03* (2013.01); *H03F 2200/129* (2013.01); *H03F 2200/462* (2013.01)

(58) Field of Classification Search
CPC . H03F 3/21; H03F 3/187; H03F 3/213; H03F 3/45475; H03F 1/32; H03F 1/56; H03F 2200/129; H03F 2200/462; H03F 2200/03
USPC ..... 381/121, 96, 95, 120; 330/260, 293, 294
See application file for complete search history.

(56) References Cited

U.S. PATENT DOCUMENTS 2,190,318 A    2/1940   Kellogg
2,887,532 A    10/1956  Werner (Continued)

*Primary Examiner* — David Ton
(74) *Attorney, Agent, or Firm* — Laurence S. Roach, Esq.

(57) ABSTRACT

An audio amplifier apparatus includes an audio amplifier which receives a single audio signal and produces a plus phase audio signal and a minus phase audio signal, both dependent upon the single audio signal. The plus phase audio signal and minus phase audio signal are received by first and second inputs of a speaker, respectively. A current sensing circuit senses a level of current received by the first or second inputs of the speaker and outputs a current sensing signal dependent upon the sensed level of current. An amplifying circuit receives and amplifies the current sensing signal. A mixer circuit receives the amplified current sensing signal and an audio drive signal and produces the single audio signal dependent upon the amplified current sensing signal and the audio drive signal. The single audio signal is produced at a node in-between two resistors.

15 Claims, 4 Drawing Sheets

(51) Int. Cl.
*H03F 3/213* (2006.01)
*H03F 3/45* (2006.01)

(56) References Cited

U.S. PATENT DOCUMENTS

| | | | | |
|---|---|---|---|---|
| 4,943,956 A * | 7/1990 | Noro | H04R 3/04 | 333/217 |
| 5,068,903 A * | 11/1991 | Walker | H04R 3/04 | 381/59 |
| 5,537,479 A * | 7/1996 | Kreisel | H04R 3/00 | 381/89 |
| 6,104,817 A * | 8/2000 | Ding | H04R 3/00 | 381/96 |
| 7,053,705 B2 * | 5/2006 | Hench | H03F 1/08 | 330/102 |
| 8,401,207 B2 * | 3/2013 | Stanley | H03F 1/32 | 333/102 |
| 9,225,301 B2 * | 12/2015 | Fay | H03F 1/56 | |
| 2002/0159606 A1 * | 10/2002 | Hobelsberger | H04R 3/002 | 381/96 |
| 2009/0003628 A1 * | 1/2009 | Kirn | H04R 3/007 | 381/96 |
| 2012/0230513 A1 * | 9/2012 | Yoneda | H04R 3/02 | 381/96 |

\* cited by examiner

AMPLIFIER APPARATUS WITH CONTROLLED NEGATIVE OUTPUT IMPEDANCE

CROSS-REFERENCE TO RELATED APPLICATION

This application is a continuation-in part of U.S. patent application Ser. No. 13/718,400, filed on Dec. 18, 2012, which is currently under allowance, the disclosure of which are hereby incorporated by reference in their entirety for all purposes.

BACKGROUND OF THE INVENTION

1. Field of the Invention

The present invention relates to an audio amplifier, and, more particularly, to an audio amplifier in which negative output impedance is controlled.

2. Description of the Related Art

Although negative output impedance amplifiers are known, car audio amplifiers generally do not exhibit negative output impedance. Neither anticipated nor obvious in view of the prior art, however, is a system with equalization that provides a proximate motion equivalent to electrical stimulus in conjunction with the equalization.

SUMMARY OF THE INVENTION

The invention may include sensing load current and feeding it back to a non-inverting input, thereby providing controlled positive current feedback. Accordingly, the invention may provide an amplifier and system in which the amount of negative output impedance may be precisely controlled. The negative output impedance may be frequency dependent in order to correct for mechanical speaker distortion. The amplifier system may include corrective equalization to account for frequency nonlinearities introduced by the negative output impedance when coupled with a dynamic, magnetically driven loudspeaker. The invention functions as a system with equalization, and creates a proximate motion equivalent to electrical stimulus in conjunction with the equalization.

The invention may greatly improve accurate acoustic coupling characteristics of dynamic loudspeakers. The invention may reduce many audible forms of distortion as well as parasitic driver resonances. The invention may also extend low frequency acoustic air load control. Further, the invention may adaptively reduce loudspeaker, enclosure, and driver sub-element resonances, which may enable the invention to be implemented in conjunction with non-ideal enclosures and drivers without suffering commensurate degradation of performance. The invention may also have proximal noise cancelling properties associated with correcting for acoustic noise outside the system.

The invention comprises, in one form thereof, an audio amplifier apparatus including an audio amplifier which receives a single audio signal and produces a plus phase audio signal and a minus phase audio signal, each of which is dependent upon the single audio signal. The plus phase audio signal is received by a first input of a speaker. The minus phase audio signal is received by a second input of the speaker. A current sensing circuit senses a level of current received by the first or second inputs of the speaker. The current sensing circuit outputs a current sensing signal dependent upon the sensed level of current. An amplifying circuit receives the current sensing signal, amplifies the current sensing signal, and thereby produces an amplified current sensing signal. A mixer circuit receives the amplified current sensing signal and an audio drive signal and produces the single audio signal dependent upon the amplified current sensing signal and the audio drive signal. The mixer circuit includes two resistors configured as a voltage divider. The single audio signal is produced at a node in-between the two resistors.

The invention comprises, in another form thereof, an audio amplifier apparatus including an audio speaker having a first input and a second input. An audio amplifier receives a single audio signal and produces a plus phase audio signal and a minus phase audio signal. Each of the plus phase audio signal and the minus phase audio signal is dependent upon the single audio signal. The plus phase audio signal is received by the first input of the speaker. The minus phase audio signal is received by the second input of the speaker. A current sensing circuit includes a parallel combination of a capacitor and a resistor. The current sensing circuit senses a level of current received by the first input or by the second input of the speaker at frequencies below a cutoff frequency defined by the capacitor and the resistor. The current sensing circuit outputs a anent sensing signal dependent upon the sensed level of current. An amplifying circuit receives the current sensing signal, amplifies the current sensing signal, and thereby produces an amplified current sensing signal. A mixer circuit receives the amplified current sensing signal and an audio drive signal and produces the single audio signal dependent upon the amplified current sensing signal and the audio drive signal.

The invention comprises, in yet another form thereof, an audio amplifier apparatus including an audio speaker having a first input and a second input. An audio amplifier receives a single audio signal and produces a plus phase audio signal and a minus phase audio signal. Each of the plus phase audio signal and the minus phase audio signal is dependent upon the single audio signal. The plus phase audio signal is received by the first input of the speaker. The minus phase audio signal is received by the second input of the speaker. A current sensing circuit senses a level of current received by the first input or by the second input of the speaker. The current sensing circuit outputs a current sensing signal dependent upon the sensed level of current. The current sensing signal is output as a voltage across a first node and a second node. An amplifying circuit receives and amplifies the current sensing signal, thereby producing an amplified current sensing signal. The amplifying circuit includes a first input connected to the first node and a second input connected to the second node. The amplifying circuit includes a first capacitor and a first resistor connected in parallel across an output of an operational amplifier and a negative input of the operational amplifier. The output of the operational amplifier produces the amplified current sensing signal. The amplifying circuit includes a second resistor interconnecting the negative input of the operational amplifier and the first input of the amplifying circuit. The amplifying circuit includes a second capacitor and a third resistor connected in parallel across electrical ground and a positive input of the operational amplifier. The amplifying circuit includes a fourth resistor interconnecting the positive input of the operational amplifier and the second input of the amplifying circuit. A mixer circuit receives the amplified current sensing signal and an audio drive signal and produces the single audio signal dependent upon the amplified current sensing signal and the audio drive signal.

An advantage of the present invention is that it may minimize the effect of speaker wire impedance and reduce the effect of driver and enclosure resonance.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
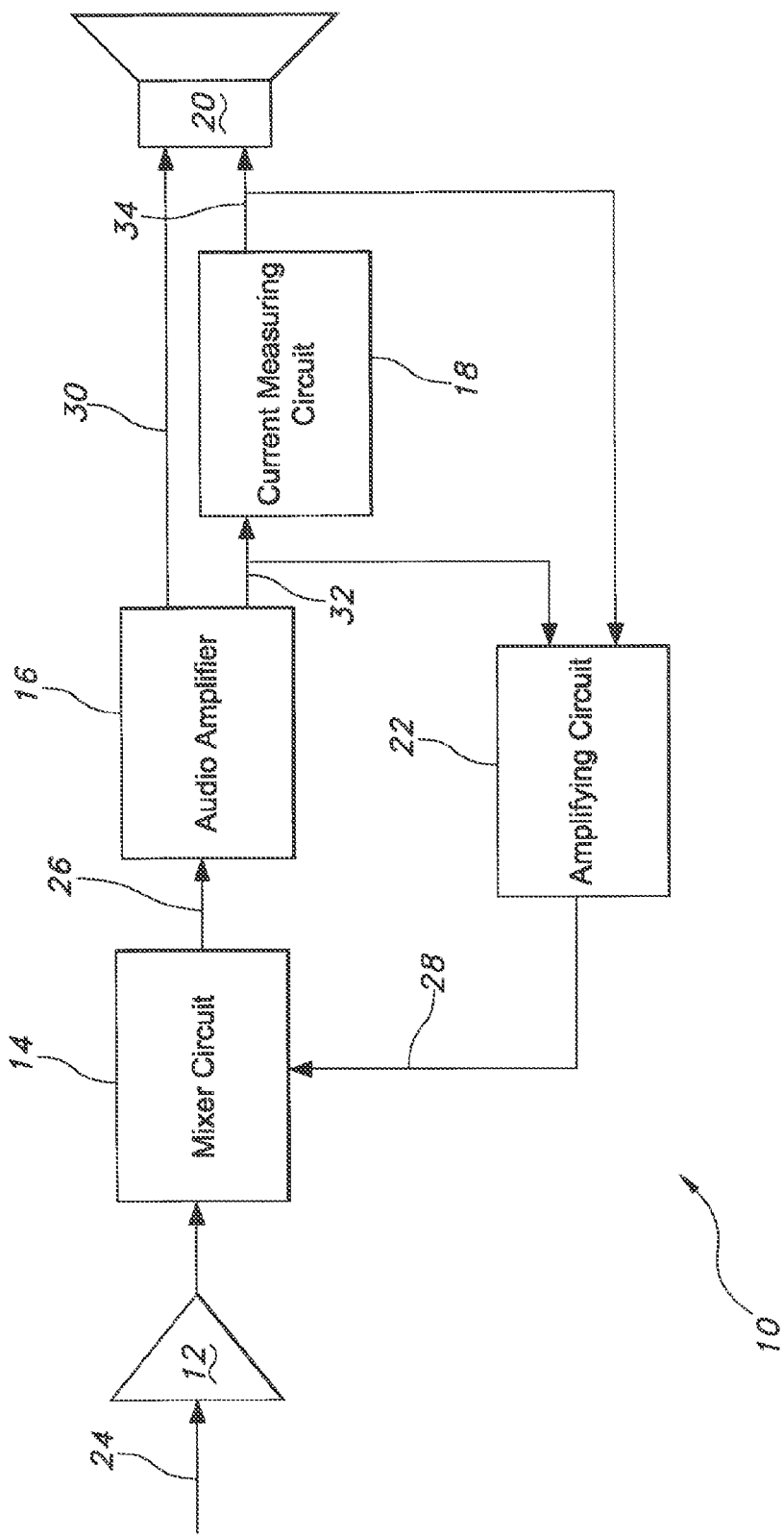
FIG. 1 is a block diagram illustrating one embodiment of an amplifier apparatus with controlled negative output impedance of the present invention.

FIG. 1 is a block diagram illustrating one embodiment of an inverse output impedance amplifier apparatus 10 of the present invention with controlled negative output impedance. Apparatus 10 may include an audio drive signal operational amplifier 12, a mixer circuit 14, an audio amplifier 16, a current measuring circuit 18, and audio speaker 20, and an amplifying circuit 22. Amplifier 12 receives an audio drive signal on input 24 and amplifies the audio drive signal. In one embodiment, amplifier 12 is in the form of a digital signal processor (DSP) circuit with an analog output converter. However, amplifier 12 may also be a conventional operational amplifier.

Apparatus 10 may create negative output impedance with respect to the audio drive signal on input 24. Due to the negative output impedance, the greater the load current, the greater the gain. That is, the gain varies with the load current. According to the invention, the amount of signal provided by amplifying circuit 22 affects the gain of the circuit 10, which varies with the load current drawn by speaker 20.

Mixer circuit 14 combines the output of amplifier 12 and the output of amplifying circuit 22. For example, mixer circuit 14 may produce on output 26 a signal with a voltage midway between the voltage output of mixer circuit 14 and the voltage output of amplifying circuit 22 on output 28.

Audio amplifier 16 receives the output of mixer circuit 14 and divides it into a plus phase signal on output 30 and a minus phase signal on output 32. The plus phase signal may be 180 degrees out of phase with the minus phase signal. The plus phase signal is fed directly into a first input of speaker 20. The minus phase signal is fed into a second input 34 of speaker 20 through current measuring circuit 18. Current measuring circuit 18 leaves the voltage of the minus phase signal substantially unchanged for input into second input 34 of speaker 20. Optionally, current measuring circuit 18 may measure current only below a selected cutoff frequency, such as 200 Hz, for example.

Output 32 of amplifier 16 and input 34 of speaker 20 may represent two outputs of current measuring circuit 18. A voltage difference between the two measuring circuit outputs 32, 34 may be proportional to the magnitude of the current received by input 34 of speaker 20.

The voltage signals on the two measuring circuit outputs 32, 34 may be received by amplifying circuit 22. Amplifying circuit 22 may produce on its output 28 a voltage signal that is proportional to the voltage difference between the two measuring circuit outputs 32, 34. Thus, the voltage signal on output 28 may be proportional to the magnitude of the current received by input 34 of speaker 20.

Figure 2:
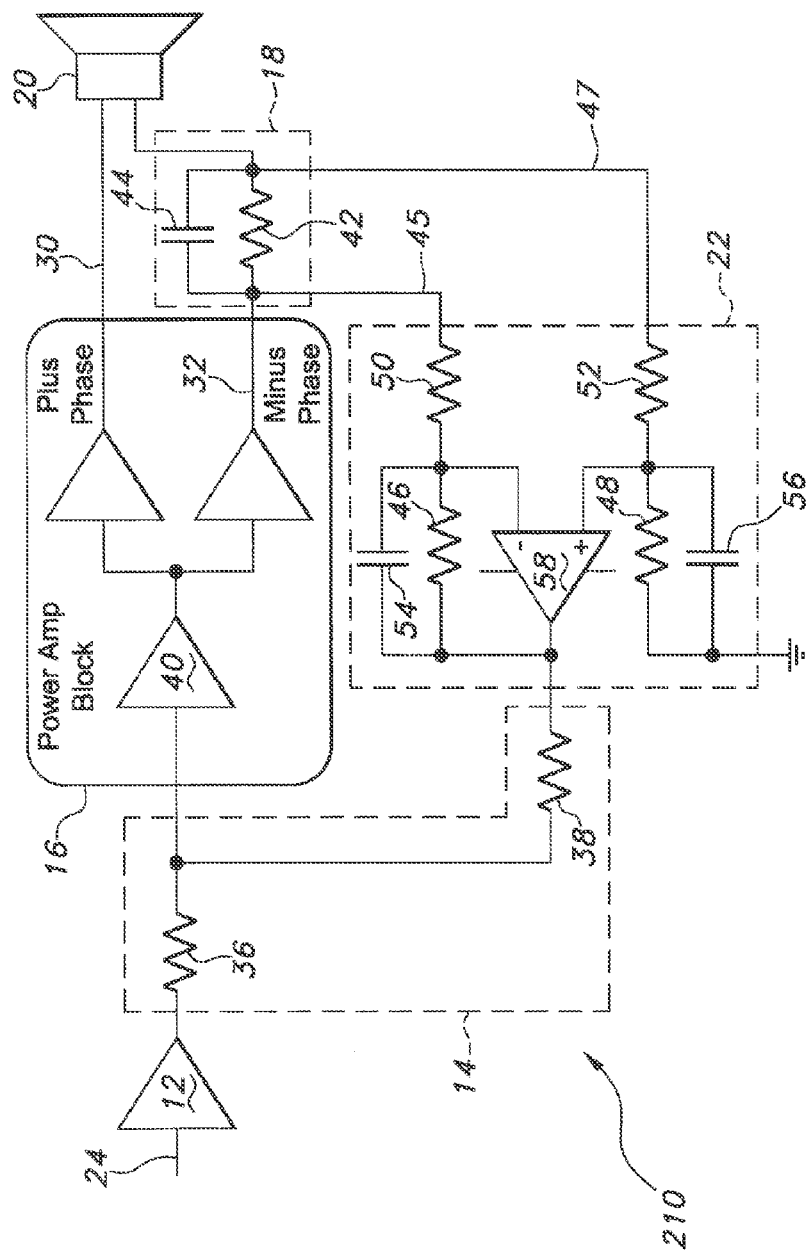
FIG. 2 is a schematic diagram of one specific embodiment of the amplifier apparatus with controlled negative output impedance of FIG. 1.

A more specific embodiment of an amplifier apparatus with controlled negative output impedance 210 of the present invention is shown in FIG. 2. Mixer circuit 14 includes a first resistor 36 and a second resistor 38, each of which has a value of 10 k ohms. However, the gain of mixer circuit 14, or the amount of feedback provided by amplifying circuit 22, may be modified by adjusting the relative values of resistors 36 and 38. Thus, resistors 36 and 38 may function as a voltage divider. A single audio signal is produced at a node in-between resistors 36, 38, and is received by audio amplifier 16.

Audio amplifier 16 may include a power amplifier block 40 whose output is divided between a plus phase output 30 and a minus phase output 32. Audio amplifier 16 may be in the form of an amplifier integrated circuit (IC).

Speaker 20 may be any dynamic (e.g., magnetically driven) loudspeaker. Speaker 20 may be connected across a bridge tied load configuration with a positive input connected to output 30 of amplifier 16 and a negative input connected to the output of current measuring circuit 18.

Current measuring circuit 18 includes a resistor 42 which may have a value of 0.01 ohm, for example. Circuit 18 may also include an optional band limit capacitor 44 such that circuit 18 measures only current below a cutoff frequency. Capacitor 44 and resistor 42 may have values which, in conjunction, produce a cutoff frequency of about 200 Hz.

Current sensing circuit 18 may sense a level of current received by input 34 of speaker 20 and may output a current sensing signal dependent upon the sensed level of current. The current sensing signal may be output as a voltage across two nodes 45, 47.

Amplifying circuit 22 may include two 1000 ohm resistors 46, 48 and two 100 ohm resistors 50, 52. Amplifying circuit 22 may include two 220 picofarad capacitors 54, 56 and an operational amplifier 58. In one embodiment, amplifier 58 may be in the form of an LM833 dual operational amplifier marketed by Texas Instruments.

Figure 3:
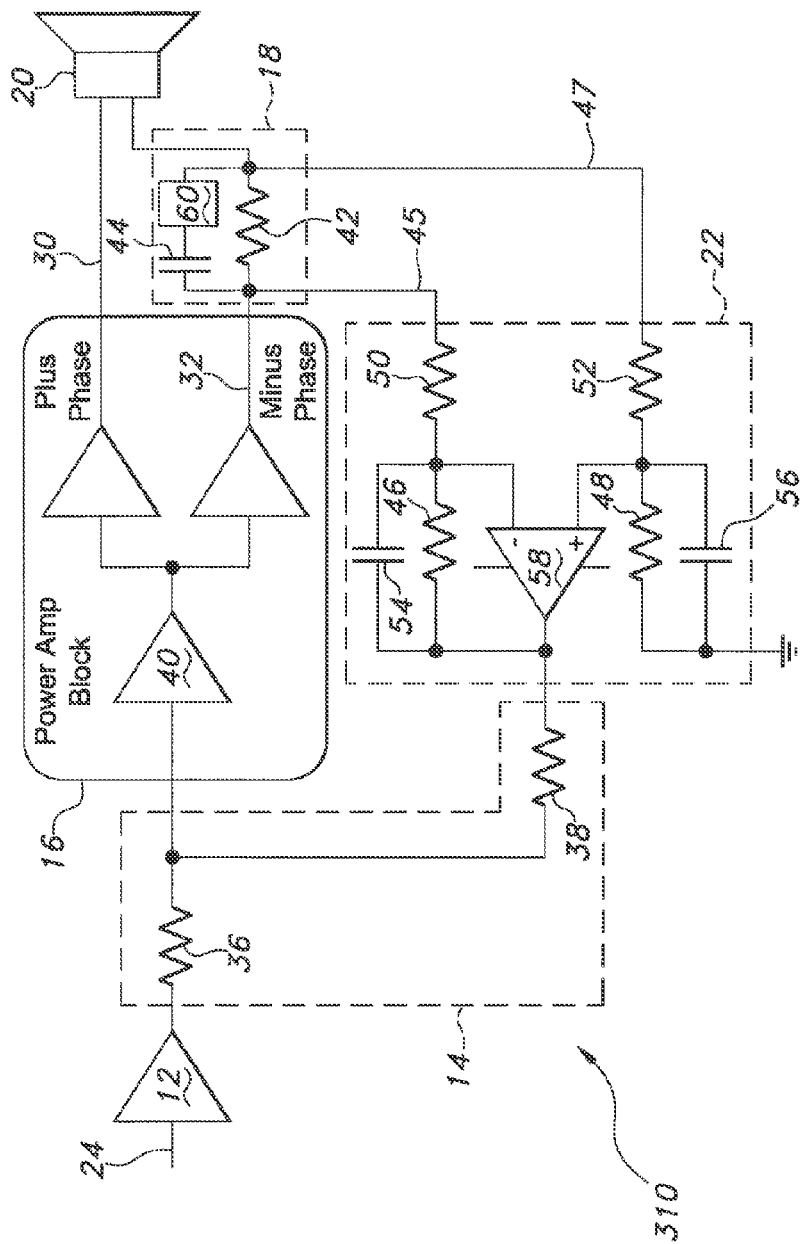
FIG. 3 is a schematic diagram of another specific embodiment of the amplifier apparatus with controlled negative output impedance of FIG. 1.

Another specific embodiment of an amplifier apparatus with controlled negative output impedance 310 of the present invention is shown in FIG. 3. Amplifier apparatus 310 may be substantially similar to amplifier apparatus 210 of FIG. 2 with the exception that apparatus 310 includes an additional network 60 connected in series with capacitor 44. Network 60 may include any combination of resistive, inductive and/or capacitive elements connected together in any combination of series and/or parallel connections. Network 60 may enable controlled tailoring of negative impedance over the entire audio frequency spectrum.

Figure 4:
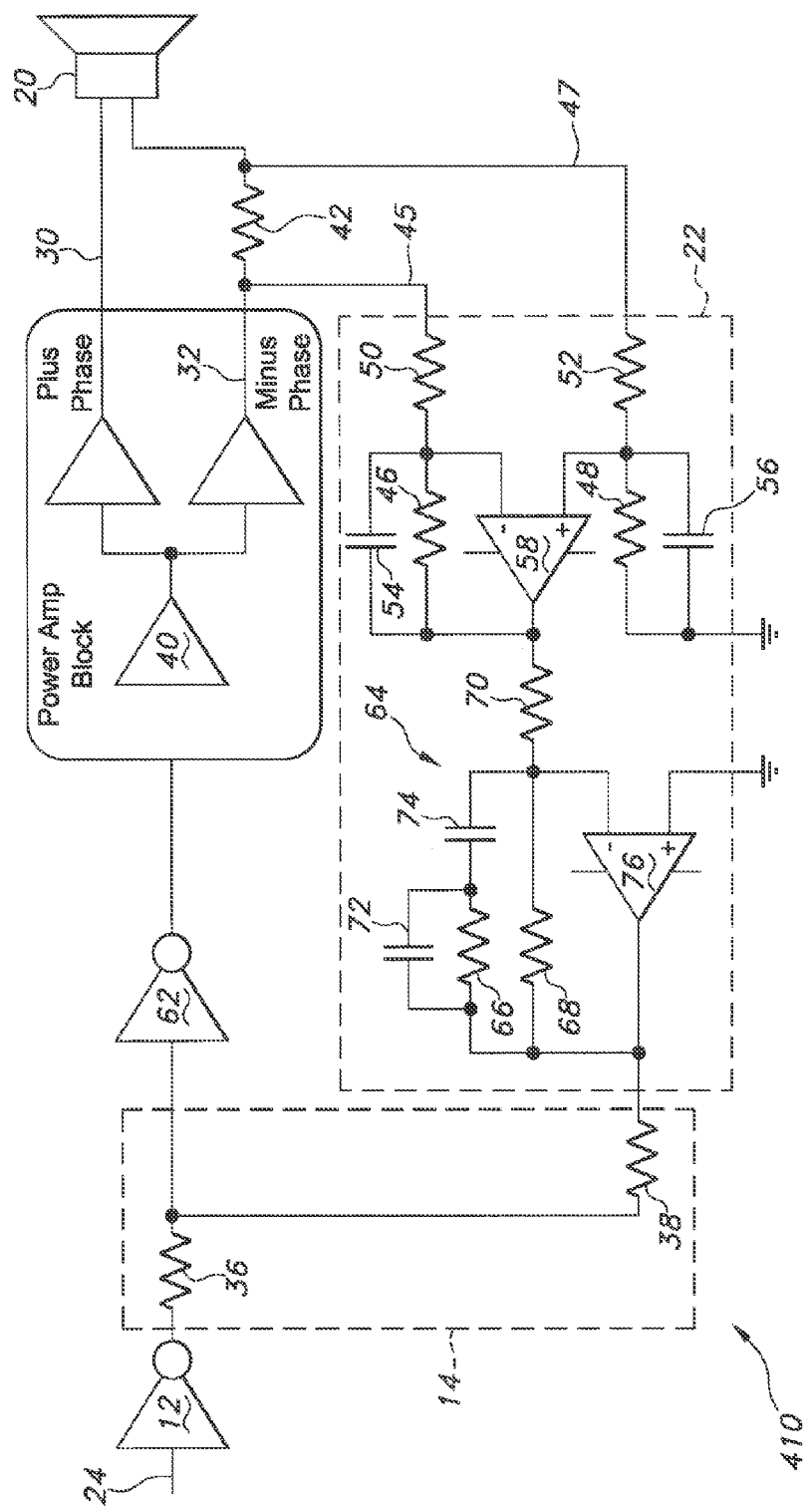
FIG. 4 is a schematic diagram of yet another specific embodiment of the amplifier apparatus with controlled negative output impedance of FIG. 1.

Yet another specific embodiment of an amplifier apparatus with controlled negative output impedance 410 of the present invention is shown in FIG. 4. Amplifier apparatus 410 maybe substantially similar to amplifier apparatus 210 of FIG. 2 with the exceptions that apparatus 410 does not include band limit capacitor 44, includes an additional amplifier or buffer 62, and amplifying circuit 22 includes an additional stage 64. Stage 64 may include a 2.5K ohm resistor 66, a 20K ohm resistor 68, and a 2K ohm resistor 70. Stage 64 may include a 0.018 microfarad capacitor 72, a 0.039 microfarad capacitor 74, and an operational amplifier 76 having its negative input connected to an output of operational amplifier 58. The 20K ohm resistor 68 and the 0.039 microfarad capacitor 74 may conjunctively define a cutoff frequency of about 200 Hz. In this embodiment, resistors 46, 48 each have a value of 1.8K ohms, resistors 50, 52 each have a value of 2K ohms, and capacitors 54, 56 each have a value of 470 picofarads.

The location of operational amplifier 76 in FIG. 4 may be an advantageous place to put all forms of equalization that can affect amplified audio. The transient sound character may be tailored using any number of frequency specific equalizing elements, and level-dependent compression/expansion may be performed at this location by amplifier 76 and associated discrete components (e.g., resistors and capacitors). This may be an advantageous location to put circuitry to perform the type of correction that may also be performed by network 60 in FIG. 3. Amplifier 76 and associated discrete components may provide sound reinforcement/enhancement with user adjustable parameters, creating audio effects that are not realizable in any other way.

Operational amplifier 58 may operate as a differential voltage receiver that receives the voltage drop across resistor 42. Operational amplifier 76 may operate as an equalizer or frequency tailoring device.

The back electro-motive force (EMF) speaker sensing of the invention corresponds to equivalent signals that may be obtained with an independent magnetic sensor. The apparatus of the invention employs basic load sensing and inverse output impedance. The invention may be used for linear motional feedback correction.

Implementation of the invention may affect total system gain, and may reduce resonance depending on the amount of gain engaged. Thus, corrective equalization refinement may be called for when activated to rematch the frequency response.

In one embodiment, an output limiter/compressor may be included in order to minimize any undesirable action at clipping.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. An audio amplifier apparatus comprising:
an audio speaker including a first input and a second input;
a current sensing circuit including a parallel combination of a capacitor and a resistive element, the current sensing circuit being configured to:
sense a level of current received by the first input or by the second input of the speaker at frequencies below a cutoff frequency defined by the capacitor and the resistive element; and
output a current sensing signal dependent upon the sensed level of current;
an amplifying circuit configured to receive the current sensing signal, amplify the current sensing signal, and thereby produce an amplified current sensing signal; and
a mixer circuit configured to receive the amplified current sensing signal and an audio drive signal and produce a single audio signal dependent upon the amplified current sensing signal and the audio drive signal.

2. The apparatus of claim 1 wherein the mixer circuit includes two resistive elements configured as a voltage divider, the single audio signal being produced at a node in-between the two resistive elements.

3. The apparatus of claim 2 wherein the mixer circuit consists of the two resistive elements.

4. The apparatus of claim 2 wherein the amplifying circuit comprises a capacitor having a capacitance and a resistor having a resistance which, in conjunction, define a cutoff frequency of the amplified current sensing signal of approximately 200 Hz.

5. The apparatus of claim 2 wherein the current sensing circuit includes a first node and a second node, a voltage difference between the first node and the second node being proportional to the current received by the first input or by the second input of the speaker, the amplifying circuit including an operational amplifier having a negative input connected to the first node through a fourth resistor, and a positive input connected to the second node through a fifth resistor.

6. The apparatus of claim 2 further comprising an audio amplifier configured to receive the single audio signal and produce a plus phase audio signal and a minus phase audio signal, each of the plus phase audio signal and the minus phase audio signal being dependent upon the single audio signal, the plus phase audio signal being received by the first input of the speaker and the minus phase audio signal being received by the second input of the speaker.

7. The apparatus of claim 1 wherein the cutoff frequency is about 200 Hz.

8. The apparatus of claim 1 wherein the capacitor has a capacitance and the resistive element has a resistance which, in conjunction, define a cutoff frequency of approximately between 150 Hz and 250 Hz.

9. The apparatus of claim 1 wherein the mixer circuit consists of two resistors.

10. The apparatus of claim 9 wherein the two resistors have a substantially equal resistance.

11. The apparatus of claim 1 wherein the amplifying circuit includes an operational amplifier having a negative input connected to the first node through a third resistor, and a positive input connected to the second node through a fourth resistor.

12. The apparatus of claim 1 further comprising an audio amplifier configured to receive the single audio signal and produce a plus phase audio signal and a minus phase audio signal, each of the plus phase audio signal and the minus phase audio signal being dependent upon the single audio signal, the plus phase audio signal being received by the first input of the speaker and the minus phase audio signal being received by the second input of the speaker.

13. An audio amplifier apparatus comprising:
an audio speaker including a first and a second input;
a current sensing circuit configured to:
sense a level of current received by the first input or by the second input of the speaker; and output a current sensing signal dependent upon the sensed level of current, the current sensing signal being output as a voltage across a first node and a second node;

an amplifying circuit including a first operational amplifier having an output connected to a negative input of a second operational amplifier, a first input of the first operational amplifier being connected to the first node and a second input of the first operational amplifier being connected to the second node, the amplifying circuit being configured to receive the current sensing signal, amplify the current sensing signal, and thereby produce an amplified current sensing signal;

a mixer circuit configured to receive the amplified current sensing signal and an audio drive signal and produce a single audio signal dependent upon the amplified current sensing signal and the audio drive signal; and an audio amplifier configured to receive the single audio signal and produce a plus phase audio signal and a minus phase audio signal, each of the plus phase audio signal and the minus phase audio signal being dependent upon the single audio signal, the plus phase audio signal being received by the first input of the speaker and the minus phase audio signal being received by the second input of the speaker.

14. The apparatus of claim 13 wherein the first operational amplifier is configured as a differential voltage receiver, and the second operational amplifier is configured as a frequency equalizer.

15. The apparatus of claim 13 wherein the mixer circuit consists of two resistors.

* * * * *